United States Patent
Nakamura

(10) Patent No.: US 12,028,052 B2
(45) Date of Patent: Jul. 2, 2024

(54) COMPOSITE FILTER DEVICE

(71) Applicant: Murata Manufacturing Co., Ltd., Nagaokakyo (JP)

(72) Inventor: Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 315 days.

(21) Appl. No.: 17/080,903

(22) Filed: Oct. 27, 2020

(65) Prior Publication Data
US 2021/0152155 A1      May 20, 2021

(30) Foreign Application Priority Data
Nov. 18, 2019   (JP) .................................. 2019-207952

(51) Int. Cl.
*H03H 9/72*     (2006.01)
*H03H 9/64*     (2006.01)

(52) U.S. Cl.
CPC .......... *H03H 9/725* (2013.01); *H03H 9/6483* (2013.01)

(58) Field of Classification Search
CPC .............................. H03H 9/725; H03H 9/6483
See application file for complete search history.

(56) References Cited

U.S. PATENT DOCUMENTS

| | | | |
|---|---|---|---|
| 2017/0117873 A1* | 4/2017 | Takata | H03H 9/54 |
| 2018/0019731 A1* | 1/2018 | Tsukamoto | H03H 9/6423 |
| 2019/0190494 A1* | 6/2019 | Nosaka | H03H 9/205 |
| 2020/0153412 A1* | 5/2020 | Nosaka | H03H 9/72 |

FOREIGN PATENT DOCUMENTS

| | | | | |
|---|---|---|---|---|
| JP | 2013-081118 A | | 5/2013 | |
| WO | WO-2019021983 A1 * | | 1/2019 | H03H 7/0161 |

\* cited by examiner

*Primary Examiner* — Patrick C Chen
(74) *Attorney, Agent, or Firm* — Keating & Bennett, LLP

(57) ABSTRACT

A composite filter device includes a transmission filter and a reception filter first and second acoustic wave filters, respectively. The first acoustic wave filter has a first pass band and the second acoustic wave filter has a second pass band higher than the first pass band. One end of the first acoustic wave filter and one end of the second acoustic wave filter are connected in common by a common terminal. The second acoustic wave filter is a ladder filter including parallel arm resonators defined by acoustic wave resonators. The inequalities of fq<fr and fr<fp<fa are satisfied, where fq and fp represent a resonant frequency and an anti-resonant frequency, respectively, of one of the parallel arm resonators having the lowest capacitance and fr and fa represent resonant frequencies and anti-resonant frequencies, respectively, of other ones of the parallel arm resonators.

12 Claims, 3 Drawing Sheets

COMPOSITE FILTER DEVICE

CROSS REFERENCE TO RELATED APPLICATIONS

This application claims the benefit of priority to Japanese Patent Application No. 2019-207952 filed on Nov. 18, 2019. The entire contents of this application are hereby incorporated herein by reference.

BACKGROUND OF THE INVENTION

1. Field of the Invention

The present invention relates to a composite filter device including a plurality of acoustic wave filters.

2. Description of the Related Art

Various multiplexers each including a plurality of band pass acoustic wave filters have been proposed. For example, Japanese Unexamined Patent Application Publication No. 2013-81118 discloses a multiplexer including a transmission filter and a reception filter. The pass band of the transmission filter is 1850 MHz to 1910 MHz. The pass band of the reception filter is 1930 MHz to 1990 MHz. This reception filter is a ladder filter and includes a plurality of parallel arm resonators and a plurality of series arm resonators.

In the multiplexer disclosed in Japanese Unexamined Patent Application Publication No. 2013-81118, there is a problem that when the pass bands of band pass filters connected in common are close to each other and an attempt is made to obtain sufficient attenuation characteristics in the pass band other than the target pass band, bandpass characteristics in the target pass band are deteriorated. It is therefore sometimes difficult to provide a composite filter device having both excellent bandpass characteristics in a target pass band and excellent isolation characteristics.

SUMMARY OF THE INVENTION

Preferred embodiments of the present invention provide composite filter devices that each include a band pass filter having a small insertion loss in the pass band of the band pass filter and that each have excellent isolation characteristics.

A composite filter device according to a preferred embodiment of the present invention includes a first acoustic wave filter having a first pass band and a second acoustic wave filter having a second pass band higher than the first pass band. One end of the first acoustic wave filter and one end of the second acoustic wave filter are connected in common by a common terminal. The second acoustic wave filter is a ladder filter including a plurality of parallel arm resonators defined by acoustic wave resonators. The inequalities of fq<fr and fr<fp<fa are satisfied, where fq and fp represent a resonant frequency and an anti-resonant frequency, respectively, of one of the parallel arm resonators which has the lowest capacitance of the parallel arm resonators and fr and fa represent resonant frequencies and anti-resonant frequencies, respectively, of other ones of the parallel arm resonators other than the acoustic wave resonator having the lowest capacitance.

According to preferred embodiments of the present invention, composite filter devices with each of which the insertion loss of a second acoustic wave filter is able to be significantly reduced and that each provide significantly improved isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below through the description of preferred embodiments of the present invention with reference to the accompanying drawings.

It is to be noted that the preferred embodiments described in this specification are merely illustrative and the configurations to be described below may be partly replaced or combined between the different preferred embodiments.

Figure 1:
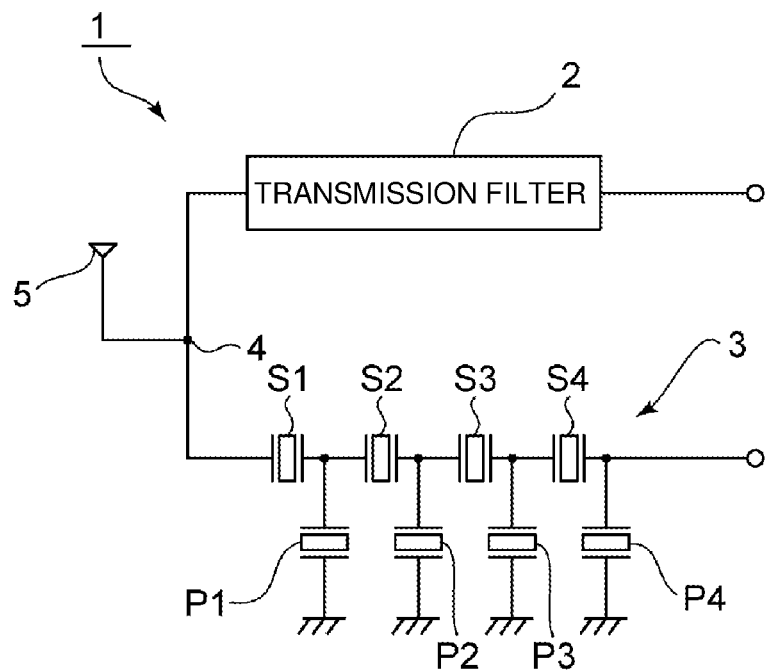
FIG. 1 is a circuit diagram of a composite filter device according to a preferred embodiment of the present invention.

FIG. 1 is a circuit diagram illustrating a duplexer that is a composite filter device according to a preferred embodiment of the present invention. A composite filter device according to a preferred embodiment of the present invention is applicable to not only a duplexer, but also a multiplexer including three or more band pass filters. That is, the present invention may be applied to various composite filter devices in which one ends of a plurality of band pass filters are connected in common.

In a composite filter device 1 illustrated in FIG. 1, one end of a transmission filter 2, which is a first acoustic wave filter, and one end of a reception filter 3, which is a second acoustic wave filter, are connected in common at a common terminal 4. The common terminal 4 is connected to an antenna 5. The composite filter device 1 includes a transmission filter and a reception filter for a smartphone, for example. The pass band of the transmission filter 2, that is, a first pass band, is preferably, for example, about 705.5 MHz to about 745.5 MHz. The pass band of the reception filter 3, that is, a second pass band, is preferably, for example, about 760.5 MHz to about 800.5 MHz. The reception filter 3 is a ladder filter. That is, the reception filter 3 includes a plurality of series arm resonators S1 to S4 and a plurality of parallel arm resonators P1 to P4. Each of the series arm resonators S1 to S4 and the parallel arm resonators P1 to P4 is defined by an acoustic wave resonator. That is, the reception filter 3 is an acoustic wave filter having a ladder circuit topology.

In the present preferred embodiment, the series arm resonators S1 to S4 and the parallel arm resonators P1 to P4 define a surface acoustic wave filter. In preferred embodiments of the present invention, an acoustic wave filter is not limited to a surface acoustic wave filter and may be an acoustic wave filter using bulk waves, for example.

A feature of the composite filter device 1 is that fq<fr and fr<fp<fa are satisfied, where fq represents the resonant frequency of the parallel arm resonator P4 having the smallest electrostatic capacitance of the parallel arm resonators P1 to P4, fp represents the anti-resonant frequency of the parallel arm resonator P4, fr represents the highest one of the resonant frequencies of the parallel arm resonators P1 to P3 other than the parallel arm resonator P4, and fa represents the lowest one of the anti-resonant frequencies of the parallel arm resonators P1 to P3 in the reception filter 3. Accordingly, the insertion loss in the pass band of the reception filter 3 is able to be significantly reduced and isolation characteristics are able to be significantly improved.

Figure 2:
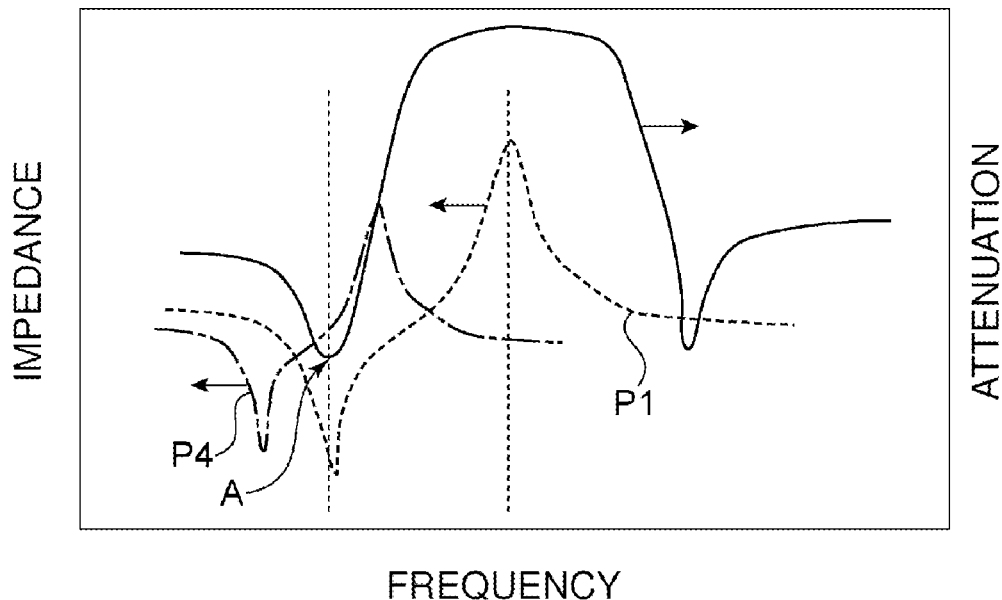
FIG. 2 is a diagram illustrating the relationship between a pass band and the impedance characteristics of a parallel arm resonator in a composite filter device according to a preferred embodiment of the present invention.

FIG. 2 is a diagram illustrating the relationship between the filter characteristics in the pass band of the reception filter 3 and the impedance characteristics of the parallel arm resonators P1 and P4.

Referring to FIG. 2, a solid line represents the filter characteristics of the reception filter 3, that is, attenuation-frequency characteristics. A dot-and-dash line represents the impedance characteristics of the parallel arm resonator P4. A broken line represents the impedance characteristics of the parallel arm resonator P1. The electrostatic capacitance of the parallel arm resonator P4 is set to be smaller than the capacitances of the parallel arm resonators P1 to P3. Specifically, the number of pairs of electrode fingers in the parallel arm resonator P4 is set to be smaller than the numbers of pairs of electrode fingers in the parallel arm resonators P1 to P3. Alternatively, the electrode finger pitch of the parallel arm resonator P4 may be set to be smaller than the electrode finger pitches of the parallel arm resonators P1 to P3. In the impedance characteristics of the parallel arm resonator P4, the resonant frequency is located on the lower-frequency side of an attenuation pole A in the filter characteristics. Accordingly, a relatively large attenuation is provided on the lower-frequency side of the attenuation pole in the pass band of the reception filter 3. A relatively large attenuation can therefore be provided in the pass band of the transmission filter 2 located on the lower-frequency side of the pass band of the reception filter 3. Accordingly, isolation characteristics are able to be significantly improved.

Figure 3:
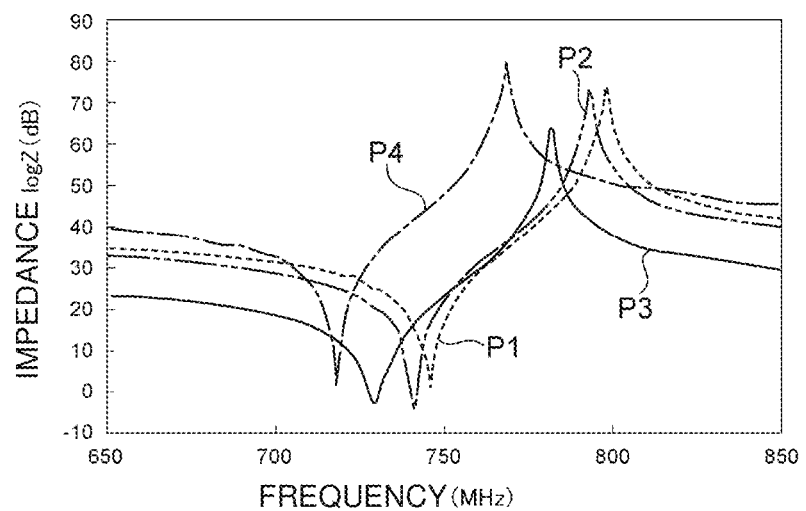
FIG. 3 is a diagram showing the impedance characteristics of a parallel arm resonator.

FIG. 3 is a diagram illustrating the impedance characteristics of the parallel arm resonators P1 to P4. As shown in FIG. 3, the resonant frequency fq and the anti-resonant frequency fp of the parallel arm resonator P4 are located at frequency positions lower than the resonant frequencies and the anti-resonant frequencies of the parallel arm resonators P1 to P3 other than the parallel arm resonator P4. Accordingly, at the anti-resonant frequencies of the parallel arm resonators P1 to P3, a signal is significantly reduced or prevented from flowing through the parallel arm resonators P1 to P3, and the signal instead flows through the series arm resonators S1 to S4. Therefore, the insertion loss in the pass band of the reception filter 3 is able to be significantly reduced.

Figure 4:
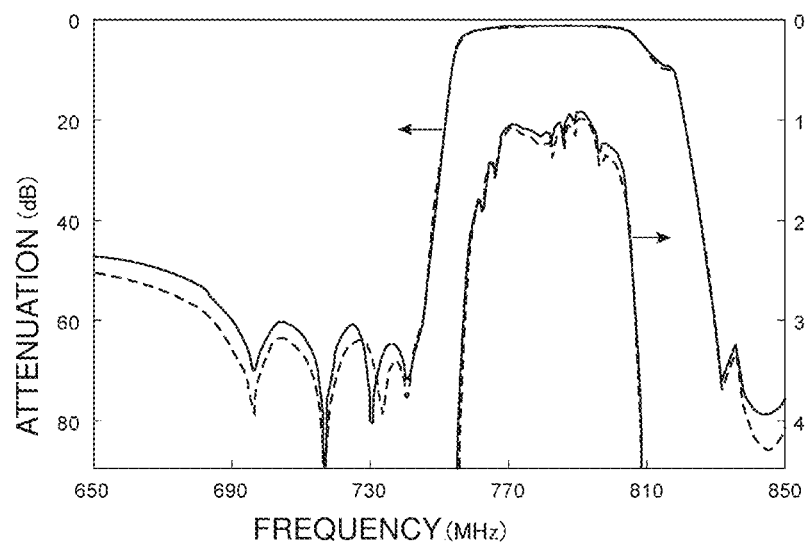
FIG. 4 is a diagram showing the filter characteristics of a composite filter device according to a preferred embodiment of the present invention and a composite filter device that is a comparative example.
Figure 5:
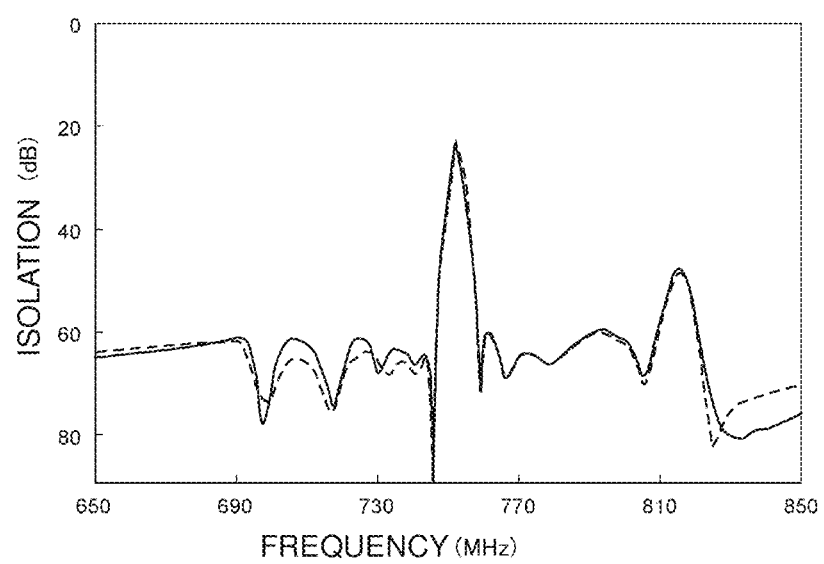
FIG. 5 is a diagram showing the isolation characteristics of a composite filter device according to a preferred embodiment of the present invention and a composite filter device that is a comparative example.

FIG. 4 is a diagram illustrating the filter characteristics of a composite filter device according to the present preferred embodiment and a composite filter device that is a comparative example. FIG. 5 is a diagram illustrating isolation characteristics.

Referring to FIGS. 4 and 5, a solid line represents a result in the present preferred embodiment and a broken line represents a result in the comparative example.

As shown in FIGS. 4 and 5, attenuation is able to be further significantly reduced in the attenuation band lower than the pass band, that is, the pass band of the transmission filter 2, in the case of the preferred embodiment as compared with the comparative example. Further, an insertion loss is able to be further significantly reduced in the pass band of the reception filter 3 in the case of the preferred embodiment as compared with the comparative example.

In preferred embodiments of the present invention, the position of the parallel arm resonator having the lowest capacitance is not particularly limited. However, the parallel arm resonator having the lowest capacitance is preferably, for example, a parallel arm resonator other than the parallel arm resonator nearest to the common terminal 4 of the parallel arm resonators. Since the parallel arm resonator nearest to the common terminal 4 has a large influence, the parallel arm resonator having the lowest capacitance is preferably a parallel arm resonator other than the parallel arm resonator nearest to the common terminal 4, for example.

Although the first acoustic wave filter and the second acoustic wave filter are preferably, for example, a Band28 transmission filter and a Band28 reception filter, respectively, in a preferred embodiment of the present invention, the first acoustic wave filter and the second acoustic wave filter may be a transmission filter and a reception filter for different bands or may be GPS band pass filters or Wi-Fi® band pass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
    a first acoustic wave filter having a first pass band; and
    a second acoustic wave filter having a second pass band higher than the first pass band; wherein
    one end of the first acoustic wave filter and one end of the second acoustic wave filter are connected in common by a common terminal;
    the second acoustic wave filter is a ladder filter including a plurality of parallel arm resonators defined by acoustic wave resonators;
    fq<fr and fr<fp<fa are satisfied, where fq and fp represent a resonant frequency and an anti-resonant frequency, respectively, of a first one of the plurality of parallel arm resonators which has a lowest capacitance of the plurality of parallel arm resonators and fr and fa represent resonant frequencies and anti-resonant frequencies, respectively, of other ones of the plurality of parallel arm resonators other than the first one of the plurality of parallel arm resonators having the lowest capacitance; and
    of the plurality of parallel arm resonators, the first one of the plurality of parallel arm resonators is farthest from the common terminal.

2. The composite filter device according to claim 1, wherein the second acoustic wave filter is a reception filter.

3. The composite filter device according to claim 2, wherein
    the common terminal is to be connected to an antenna; and the first one of the plurality of parallel arm resonators having the lowest capacitance is different from a second one of the plurality of parallel arm resonators that is nearest to the common terminal of the plurality of parallel arm resonators.

4. The composite filter device according to claim 3, wherein
the first one of the plurality of parallel arm resonators and the second one of the plurality of parallel arm resonators are connected in parallel; and
a series arm resonator is connected between a ground and a node between the first and second ones of the plurality of parallel arm resonators.

5. The composite filter device according to claim 1, wherein the second acoustic wave filter is a surface acoustic wave filter.

6. The composite filter device according to claim 1, the first acoustic wave filter is a transmission filter.

7. The composite filter device according to claim 1, wherein
the first pass band is about 705.5 MHz to about 745.5 MHz; and
the second pass band is about 760.5 MHz to about 800.5 MHz.

8. The composite filter device according to claim 1, wherein the second acoustic wave filter further includes a plurality of series arm resonators defined by acoustic wave resonators.

9. The composite filter device according to claim 1, wherein
the first acoustic wave filter is a Band28 transmission filter; and
the second acoustic wave filter is a Band28 reception filter.

10. The composite filter device according to claim 1, wherein the plurality of parallel arm resonators includes at least three parallel arm resonators.

11. The composite filter device according to claim 1, wherein another end of the first acoustic wave filter and another end of the second acoustic wave filter are not directly connected in common.

12. The composite filter device according to claim 1, wherein the composite filter device is configured to function as a duplexer or a multiplexer.

* * * * *